United States Patent
Ishikawa et al.

(10) Patent No.: US 7,245,184 B2
(45) Date of Patent: Jul. 17, 2007

(54) HIGH FREQUENCY POWER AMPLIFIER CIRCUIT, HIGH FREQUENCY POWER AMPLIFIER ELECTRONIC COMPONENT AND METHOD THEREOF

(75) Inventors: Makoto Ishikawa, Takasaki (JP);
Hirokazu Tsurumaki, Miyogi (JP);
Masahiro Kikuchi, Fujioka (JP);
Hiroyuki Nagai, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/858,373

(22) Filed: Jun. 2, 2004

(65) Prior Publication Data

US 2004/0263256 A1   Dec. 30, 2004

(30) Foreign Application Priority Data

Jun. 27, 2003   (JP) .............................. 2003-184307

(51) Int. Cl.
*H03F 3/04* (2006.01)
(52) U.S. Cl. ...................................... 330/296; 330/288
(58) Field of Classification Search ..................... None
See application file for complete search history.

(56) References Cited

U.S. PATENT DOCUMENTS 5,680,079 A * 10/1997 Inami et al. ................ 333/161
6,043,714 A * 3/2000 Yamamoto et al. ......... 330/296
6,344,775 B1 * 2/2002 Morizuka et al. ........... 330/288
6,873,012 B2 * 3/2005 Stecher et al. .............. 257/347
2006/0033577 A1 * 2/2006 Nakamizo et al. .......... 330/296

FOREIGN PATENT DOCUMENTS

JP   2003-017954   1/2003

* cited by examiner

*Primary Examiner*—Robert Pascal
*Assistant Examiner*—Alan Wong
(74) *Attorney, Agent, or Firm*—Mattingly, Stanger, Malur & Brundidge PC

(57) ABSTRACT

A high frequency power amplifier electronic component (RF power module) is so constituted as to apply bias to an amplifier FET in current mirror configuration. In this RF power module, deviation of a bias point due to the short channel effect of the FET is corrected, and variation in high frequency power amplifier characteristics reduced. The high frequency power amplifier circuit (RF power module) is so constituted that the bias voltage for the amplifier transistor in a high frequency power amplifier circuit is supplied from a bias transistor connected with the amplifier transistor in current mirror configuration. In addition to a pad (external terminal) connected with the control terminal of the amplifier transistor, a second pad is provided which is connected with the control terminal of the bias transistor connected with the amplifier transistor in current mirror configuration.

11 Claims, 12 Drawing Sheets

FIG. 7

| INSPECTION ITEM UPPER LIMIT LOWER LIMIT JUDGMENT | CAT. No. | X COORDINATE | Y COORDINATE | VGS (OFF) 0.90 0.68 | DIBL 0.1 0 | R1 2300 750 |
|---|---|---|---|---|---|---|
| 1F | – | 13 | 6 | – | – | – |
| 1F | – | 14 | 6 | – | – | – |
| 1F | – | 15 | 6 | – | – | – |
| 1F | – | 16 | 6 | – | – | – |
| 2P | 58 | 16 | 7 | 0.67 | 0.05 | 1171 |
| 2P | 59 | 15 | 7 | 0.666 | 0.049 | 1407 |
| 2P | 59 | 14 | 7 | 0.752 | 0.05 | 1315 |
| 2P | 59 | 13 | 7 | 0.755 | 0.051 | 1477 |
| 2P | 59 | 12 | 7 | 0.756 | 0.052 | 1517 |
| 2P | 58 | 11 | 7 | 0.761 | 0.053 | 1186 |
| 2P | 58 | 10 | 7 | 0.762 | 0.054 | 1186 |
| 1F | – | 9 | 7 | 0.764 | – | – |
| 2P | 58 | 8 | 7 | 0.798 | 0.053 | 1138 |
| 2P | 58 | 7 | 7 | 0.802 | 0.053 | 1135 |
| 2P | 58 | 6 | 7 | 0.801 | 0.056 | 1184 |
| 2P | 58 | 5 | 7 | 0.797 | 0.056 | 1201 |
| 2P | 58 | 4 | 7 | 0.796 | 0.039 | 1193 |
| 2P | 58 | 3 | 7 | 0.796 | 0.0405 | 1222 |
| 2P | 58 | 2 | 7 | 0.793 | 0.0363 | 1246 |
| 2P | 58 | 1 | 7 | 0.79 | 0.0321 | 1246 |
| 1F | – | 1 | 8 | 0.811 | – | – |
| 2P | 58 | 2 | 8 | 0.809 | 0.0405 | 1069 |
| 2P | 56 | 3 | 8 | 0.811 | 0.0363 | 922 |
|   |   |   |   | 0.813 |   |   |

THRESHOLD VOLTAGE OF Q2

DIBL VALUE OF Q2 → R1 CONSTANT DATA CONVERSION TABLE

2P: NON-DEFECTIVE
1F: DEFECTIVE

SiGe MOSFET

SiGe HBT ulate # HIGH FREQUENCY POWER AMPLIFIER CIRCUIT, HIGH FREQUENCY POWER AMPLIFIER ELECTRONIC COMPONENT AND METHOD THEREOF

CROSS-REFERENCE TO RELATED APPLICATION

The present application claims priority from Japanese patent application JP 2003-184307 filed on Jun. 27, 2003, the content of which is hereby incorporated by reference into this application.

BACKGROUND OF THE INVENTION

The present invention relates to a technology which is effectively applied to a high frequency power amplifier circuit and a high frequency power amplifier electronic component incorporating the high frequency power amplifier circuit. More specifically, the present invention relates to a technology for reducing variation in bias point in a high frequency power amplifier circuit which applies bias to an amplifier transistor in current mirror configuration, and a manufacturing method for the high frequency power amplifier electronic component.

The transmission-side output unit of radio communication equipment (mobile communication equipment), such as cellular phone, incorporates a high frequency power amplifier circuit. The high frequency power amplifier circuit uses a semiconductor amplifier element, such as MOSFET (field-effect transistor) and GaAs-MESFET. (In general, the high frequency power amplifier circuit is formed in multistage configuration.)

The high frequency power amplifier circuit is often constituted as one electronic component which is formed as follows: a semiconductor chip including an amplifier transistor and a bias circuit for it, a supply voltage control circuit, and the like are mounted over an insulating substrate; the insulating substrate comprises, for example, a ceramic substrate, and has printed wiring formed over and in it; and the semiconductor chip is mounted together with other semiconductor chips and discrete components, such as capacitors, and these components are connected by the above printed wiring or bonding wires. This electronic component is designated as RF power module.

With respect to the semiconductor chip for use in RF power modules for cellular phone, the packing density has been being increased for enhancement of the performance of and reduction of the size of modules. Recently, inventions related to such RF power modules as illustrated in FIG. 14 have been proposed from the viewpoints of stabilization of high frequency power amplifier characteristics. (Refer to Patent Document 1, for example.) The RF power module illustrated in FIG. 14 is provided with a bias transistor Q1 whose gate is connected with that of an amplifier transistor Q2. The RF power module operates as follows: a bias current Ib is generated by a current mirror circuit which comprises transistors Q3 and Q4 and duplicates a current from a constant current source CI. This bias current Ib is passed through the bias transistor Q1, and the amplifier transistor Q2 is supplied with bias in current mirror configuration.

In such an RF power module that applies bias to an amplifier FET in current mirror configuration, the drain current passed through the amplifier transistor Q2 does not change even if the threshold voltage (Vth) of the FET varies. Therefore, advantages of unnecessary correction and enhanced yield are brought.

[Patent Document 1]

Japanese Unexamined Patent Publication No. 2003-017954

SUMMARY OF THE INVENTION

In enhancing the high frequency power amplifier characteristics of an RF power module for increasing its packing density, reducing the length of the channel of an amplifier FET is effective. However, if the channel of FET is reduced in length, it is known that a phenomenon results: as illustrated in FIG. 15, the threshold voltage Vth and the channel length modulation coefficient λ greatly vary due to variation in channel length. This phenomenon is designated as short channel effect.

In the RF power module which applies bias to an amplifier FET in current mirror configuration, a desired current mirror ratio cannot be obtained if the threshold voltage Vth or channel length modulation coefficient λ of the FET varies. As a result, the idle current of the amplifier FET deviates from a desired value, and various problems result: desired high frequency power amplifier characteristics cannot be obtained (for example, a required output current cannot be obtained), and the power consumption is increased. However, conventional RF power modules in current mirror configuration, including the prior invention, do not give any consideration to deviation of a bias point due to the short channel effect of FET. For this reason, a problem occurs: if any correcting measure is not taken, variation in high frequency power amplifier characteristics from module to module becomes too great to disregard.

To correct deviation of a bias point due to the short channel effect of FET, the characteristics of the FET must be measured with accuracy. If the characteristics of FET in such a circuit as illustrated in FIG. 14 are measured with an ordinary tester, various measuring methods are possible. One example of common measuring methods is such that: as illustrated in FIG. 16, a predetermined voltage Vds is applied to the drain terminal of FET Q2 through a pad P1, and a voltage Vgs applied to the gate terminal of the FET Q2 through a pad P2 is varied. Then, the magnitude of a current flowing out of a pad P3 as ground terminal is measured, and the threshold voltage of Q2 is computed.

However, it was revealed that this measuring method posed a problem: the FET Q1 which constitutes a current mirror together with the FET Q2 is an element in so-called diode connection wherein its gate and drain are joined with each other. Therefore, it is difficult to measure only the drain current Idd2 passed through Q2 with accuracy because of a leakage current IL flowing from the pad P2 to P3 through Q1.

To cut the leakage current IL flowing from the pad P2 to P3 through Q1, consideration was given to installing a switch element (transistor) at a point marked with "A" in FIG. 16. However, this is undesirable because the bias point of the amplifier FET Q2 is varied due to the influences of the on resistance of the additionally inserted transistor and the like.

In the high frequency amplifier circuit in FIG. 14, bipolar transistors are used sometimes instead of the FETs Q1 to Q4. The bipolar transistor does not involve the short channel effect but involves Early effect. This is a phenomenon wherein even if the base-emitter voltage is kept constant, the effective base width is reduced and the collector current is increased as the collector-emitter voltage increases. For this reason, if an element with the reduced base thickness of the transistor is formed in a high frequency amplifier circuit using bipolar transistors for the enhancement of high frequency power amplifier characteristics, a problem occurs: if the element size (thickness of base) is varied from chip to chip due to production tolerance, the bias point of the base is dispersed from chip to chip due to the influences of the Early effect. As a result, there is a possibility that the high frequency power amplifier characteristics cannot be stabilized. In a current mirror circuit comprising bipolar transistors, a collector current corresponding to an emitter size ratio is passed through.

An object of the present invention is to correct deviation of a bias point due to the short channel effect of FET to enable reduction in, variation in high frequency power amplifier characteristics in a high frequency power amplifier electronic component (RF power module) which applies bias to the amplifier FET in current mirror configuration.

Another object of the present invention is to correct deviation of a bias point due to the Early effect of bipolar transistors to enable reduction in variation in high frequency power amplifier characteristics in a high frequency power amplifier electronic component (RF power module) which applies bias to the amplifier transistor in current mirror configuration.

A further object of the present invention is to measure the characteristics of an amplifier transistor with accuracy to enable correction of deviation of a bias point and reduction in variation in high frequency power amplifier characteristics in a high frequency power amplifier electronic component (RF power module) which applies bias to the amplifier transistor in current mirror configuration.

Still a further object of the present invention is to provide a high frequency power amplifier circuit which exhibits a narrow range of variation in high frequency power amplifier characteristics and enables reduction in size and increase in packing density, and a high frequency power amplifier electronic component (RF power module) incorporating the high frequency power amplifier circuit.

Still a further object of the present invention is to provide a manufacturing method for a high frequency power amplifier electronic component (RF power module) wherein variation in high frequency power amplifier characteristics is reduced.

The above and other objects and novel features of the present invention will become apparent from the following description and the accompanying drawings.

Representative aspects of the present invention disclosed in this specification will be generally described below:

A first aspect of the present invention is a high frequency power amplifier circuit (RF power module) so constituted that a bias voltage for the amplifier transistor in the high frequency power amplifier circuit is supplied from a bias transistor connected with the amplifier transistor in current mirror configuration. The high frequency power amplifier circuit is provided with an cut off means for preventing a current from flowing in or out to the control terminal (gate terminal or base terminal) of the amplifier transistor via a path other than the input terminal for high frequency signal.

More specifically, in addition to the pad (external terminal) connected with the control terminal of the amplifier transistor, a second pad is provided. The second pad is connected with the control terminal of the bias transistor which is connected with the amplifier transistor in current mirror configuration. Then, in normal use, the two pads are electrically connected with each other by a ball or wire for bonding. The two pads are preferably disposed in proximity to each other.

According to the above means, since the cut off means is provided or the pads are separately provided, the control terminal of the amplifier transistor and the control terminal of the bias transistor can be separated from each other. Thus, leakage currents are eliminated, and the characteristics of the amplifier transistor can be measured with accuracy. Further, since the two pads are disposed in proximity to each other, the two pads can be electrically connected with each other only by forming a ball for bonding. Therefore, the characteristics of the amplifier transistor can be measured without any change to the manufacturing process. Further, since a short-channel FET or bipolar transistor with smaller base width is used as amplifier transistor, the following advantage is brought: if an attempt is made to enhance high frequency power amplifier characteristics, the characteristics of the amplifier transistor can be measured with accuracy even if they deviate from desired values due to production tolerance.

In addition, a standard transistor of non-short channel is connected in series with the bias transistor, and further a transistor in diode connection which constitutes a current mirror circuit together with that transistor is provided. Then, a terminal of the transistor in diode connection is connected with another pad. Thus, variation in the characteristics of the amplifier transistor can be simply corrected. This is done by adjusting the resistance value of an external resistor connected with the another pad according to the result of measurement of the characteristics of the amplifier transistor.

A second aspect of the present invention is a manufacturing process for a high frequency power amplifier circuit wherein the bias voltage for the amplifier transistor in a high frequency power amplifier circuit is supplied from a bias transistor connected with the amplifier transistor in current mirror configuration. The manufacturing process is such that: in a probe inspection process for a wafer which underwent a wafer process, the characteristics of the amplifier transistor are measured with respect to each chip, and thereby the resistance values of resistors for adjustment are determined. The determined resistance values are stored as table data in a storage device. In an assembly process for assembling modules, the table data is used to select a resistor for adjustment most suitable for the high frequency power amplifier circuit to be mounted. Then, the resistor for adjustment is mounted over the same insulating substrate as the amplifier circuit.

According to this manufacturing method, a resistor for adjustment to be used is determined based on the result of measurement in the probe inspection process. A resistance element having the determined resistance value is combined with the high frequency power amplifier circuit and mounted together. Thus, a high frequency power amplifier electronic component (RF power module) with less variation in characteristics is obtained. As a result, if FET with a short channel length or a bipolar transistor with small base width is used as amplifier transistor in a high frequency power amplifier circuit to enhance its high frequency power amplifier characteristics and reduce its size, also, the following advantages are brought: variation in characteristics from module to module can be reduced, and such modules can be manufactured without any significant change to the conventional manufacturing process.

BRIEF DESCRIPTION OF THE DRAWINGS

FIG. 7 is an explanatory drawing illustrating an example of a measurement data list created during the manufacturing process for the RF power module in the embodiments.

DETAILED DESCRIPTION OF THE PREFERRED EMBODIMENTS

Figure 1:
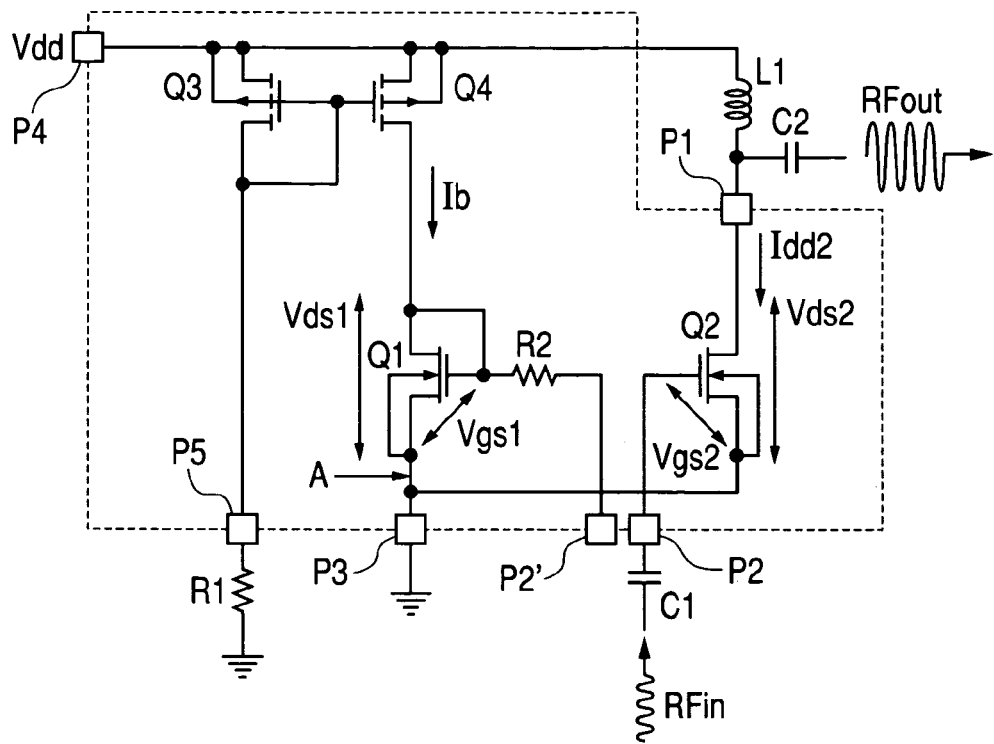
FIG. 1 is a circuitry diagram schematically illustrating the constitution of an first embodiment of the high frequency power amplifier circuit according to the present invention.

Referring to the drawings, the embodiments of the present invention will be described in detail below.

FIG. 1 schematically illustrates the constitution of the first embodiment of the high frequency power amplifier circuit according to the present invention. The high frequency power amplifier circuit in the embodiment in FIG. 1 is formed as semiconductor integrated circuit over one semiconductor chip though its constitution is especially not limited to this. The RF power module is constituted by the following procedure: for example, three such high frequency power amplifier circuits are connected in cascade connection, and mounted over an insulating substrate made of ceramic or the like, together with external resistance elements and capacitive elements. The high frequency power amplifier circuits in the respective stages are identical in constitution with that in FIG. 1. However, they are different in the size (gate width) of amplifier FET, and the power amplifier in the first stage uses the largest one and that in the third stage uses the smallest one.

The high frequency power amplifier circuit in this embodiment comprises an amplifier FET Q2 connected bewteeen an output pad P1 and ground line GND; a bias FET Q1 whose gate is connected with the gate of the amplifier FET Q2; a p-channel standard MOSFET Q4 connected in series with Q1 between the drain terminal of the bias FET Q1 and a supply voltage terminal P4; and a p-channel standard MOSFET Q3 whose gate is connected with the gate of the MOSFET Q4. The MOSFETs Q1 and Q3 are each in diode connection and their gate and drain are connected together, respectively. Thus, Q1 and Q2 constitute a current mirror circuit, and Q3 and Q4 constitute another current mirror circuit.

As mentioned above, the MOSFETs Q3 and Q4 which supply a current to the bias FET Q1 are connected in current mirror configuration. At the same time, the amplifier FET Q2 and the bias FET Q1 are connected in current mirror configuration. Therefore, the gate bias point of Q1 is stabilized even if Vth of Q1 and Q2 is varied due to fluctuation in supply voltage Vdd or fluctuation in temperature. Thus, fluctuation in the high frequency power amplifier characteristics of Q1 can be reduced.

The drain terminal of the MOSFET Q3 is connected with a pad P5, and an external resistor R1 is connected with the pad P5 so that the external resistor R1 is connected in series with the MOSFET Q3. Thus, the gate bias point of the amplifier FET Q2 can be adjusted by adjusting the value of the resistor R1 to adjust the current passed through the MOSFETs Q3, Q4, and Q1. Capacitors C1 and C2 connected with the pads P1 and P2 outside the chip are capacitive elements for cutting the direct-current components in high frequency signals. Reference code L1 denotes an inductance for impedance matching connected between the pad P1 and supply voltage Vdd. The inductance L1 can be constituted of a microstrip line formed over the substrate of the module.

The high frequency power amplifier circuit in this embodiment is provided with a pad P2' in addition to the pad P2 for inputting a high frequency signal Rfih to the gate terminal of the amplifier FET Q2. The pad P2' is connected with the gate terminal of the bias FET Q1 through a resistor R2. The resistor R2 is an element which prevents high frequency components from leaking to the bias FET Q1. When the pads P2 and P2' are mounted as elements constituting the module, they are connected together by a bonding ball or the like and fed with the same signals. For this reason, on the assumption that the bonding ball diameter is 85 μm, the spacing between the pads P2 and P2' in this embodiment is set to as small a value as 10 μm, for example. The pads P2 and P2' are so sized that the length of each side of them is, for example, 110 μm.

The standard MOSFETs Q3 and Q4 which constitute a current mirror are so set that the ratio of their gate widths is, for example, 1:4. Thus, a current four times that passed through Q3 is passed through Q4. Also, the amplifier FET Q2 and the bias FET Q1 constitute a current mirror, and are so set that the ratio of the gate widths of Q1 and Q2 is, for example, 1: several hundred to several thousand. Thus, a current whose magnitude is near several hundred to several thousand times that of a current passed through Q1 is passed through Q2. In this embodiment, while the channel length of the MOSFETs Q3 and Q4 is set to, for example, 2 μm, the channel length of the amplifier FET Q2 and the bias FET Q1 is set to, for example, 0.3 μm. Thus, they are short-channel FETs which are smaller in channel length than the standard MOSFETs Q3 and Q4.

Thus, the high frequency amplifier characteristics of the amplifier FET Q2 is more favorable as compared with cases where a standard MOSFET is used. Since the channel length of the amplifier FET Q2 is short, the area occupied by Q2 is reduced as well, and the chip size is made smaller as compared with cases where a standard MOSFET is used.

In this embodiment, the MOSFETs Q3 and Q4 constituting a current mirror circuit which generates a bias current Ib passed through the bias FET Q1 use standard MOSFETs whose channel length is 2 μm. Therefore, even if the channel length is varied due to production tolerance, the characteristics (Vth, λ) of the elements hardly vary, as is evident from FIG. 15. For this reason, the bias current Ib let to flow from the MOSFET Q3 to the bias FET Q1 can be made substantially constant regardless of any production tolerance.

Figure 15:
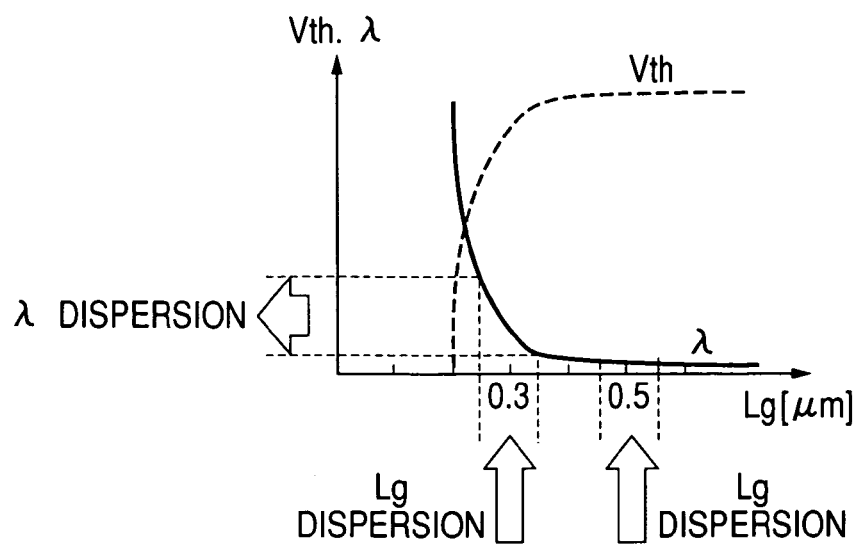
FIG. 15 is a graph showing the relation between channel length, threshold voltage Vth, and channel length modulation coefficient λ observed when the channel length of FET is reduced.

The amplifier FET Q2 and the bias FET Q1 connected with the amplifier FET Q2 in current mirror configuration are small in channel length. Therefore, the channel length of the FETs Q1 and Q2 is varied due to process tolerance, the characteristics (threshold voltage Vth and channel length modulation coefficient λ) of the FETs are accordingly varied, as illustrated in FIG. 15. As a result, the ratio of the currents passed through the bias FET Q1 and the amplifier FET Q2 changes, and this results in deviation of the gate bias point of Q2 and variation in high frequency amplifier characteristics.

More specific description will be given. The assumption is made that standard MOSFETs are used for the bias FET Q1 and the amplifier FET Q2. If the current Ib supplied from the MOSFET Q4 is set to such a value that the FET Q1 operates in the saturation region expressed as Vds>(Vgs−Vth)>0, the same voltage as the gate voltage of Q2 is applied to the gate terminal of Q1. Therefore, the current Idd expressed by Expression (1) below which indicates the drain current characteristics in the saturation region is passed through Q1 and Q2:

$$Idd1 = K0 \cdot Wg1/Lg1 \cdot (Vgs1 - Vth1)^2 \quad (1)$$

$$Idd2 = K0 \cdot Wg2/Lg2 \cdot (Vgs2 - Vth2)^2$$

where, $K0$ is the unit transconductance coefficient of the FETs; $Wg1$ and $Wg2$ are the gate widths of the FETs Q1 and Q2; and $Lg1$ and $Lg2$ are the gate lengths of the FETs Q1 and Q2. If the FETs Q1 and Q2 are formed over the same semiconductor chip, the range of variation in element size within chip is very narrow, and thus $Lg1=Lg2$. Further, the threshold voltages $Vth1$ and $Vth2$ hardly differ from each other. As mentioned above, the ratio of the gate widths $Wg1$ and $Wg2$ is set to 1: several hundred to several thousand. For this reason, by Expression (1), the drain currents Idd1 and Idd2 passed through Q1 and Q2 are brought into the relation in proportion to the ratio of the gate widths $Wg1$ and $Wg2$, as indicated by Expression (2) below:

$$Idd2 = Wg2/Wg1 \cdot Idd1 \quad (2)$$

It turns out from this that: the gate bias point of the FET Q2 is uniquely determined by the drain current Idd1 passed through Q1. Meanwhile, if short-channel FETs are used for the bias FET Q1 and the amplifier FET Q2 as in this embodiment, the drain currents Idd1 and Idd2 passed through Q1 and Q2 are in the relation expressed by Expression (3) below:

$$Idd2 = Wg2/Wg1 \cdot (1+\lambda2 \cdot Vds2)/(1+\lambda1 \cdot Vds1)Idd1 \quad (3)$$

The bias FET Q1 is FET in diode connection whose gate terminal and drain terminal are connected together. Therefore, by Vds1=Vgs1, Expression (3) can be transformed into Expression (4) below:

$$Idd2 = Wg2/Wg1(1+\lambda2 \cdot Vds2)/(1+\lambda1 \cdot Vgs1)Idd1 \quad (4)$$

Since the drain of Q2 is connected in series with the power supply Vdd, the drain-source voltage Vds2 in Expression (4) is constant. However, it turns out from Expression (5) obtained by transforming Expression (1) that: if the threshold voltage Vth1 is varied by the short channel effect, the gate-source voltage Vgs1 of Q2 is varied as well:

$$Vgs1 = \sqrt{(Idd1 \cdot Lg1/K0 \cdot Wg1)} + Vth1 \quad (5)$$

If short-channel FETs are used, the channel length modulation coefficient λ is also varied from chip to chip due to production tolerance, as illustrated in FIG. 15. However, since the range of variation in λ within one and the same chip is narrow, λ1≈λ2. It turns out from Expression (4) that: the current ratio of the drain currents Idd1 and Idd2 of Q1 and Q2 changes if the threshold voltage and λ vary. Therefore, even if the drain current Idd1 of the FET Q1 is constant, the drain current Idd2 of Q2 cannot be made constant.

To cope with this, the high frequency amplifier circuit in this embodiment is so constituted that the following will be implemented: the resistance value of the external resistor R1 is adjusted in accordance with variation in the characteristics (Vth1 and λ1) of the FET Q1. Thereby, the bias current Ib let to flow from Q4 to Q1 is varied, and thus a drain current (idle current) of desired magnitude is passed through the amplifier FET Q2. However, to determine the resistance value of the external resistor R1, the characteristics of the bias FET Q1 must be learned. Since Q1 and Q2 are formed over the same chip, the characteristics of Q1 are similarly varied if the characteristics of Q2 are varied. For this reason, if the characteristics of Q2 are measured, the characteristics of Q1 are also learned.

A method for measuring the characteristics of the FET Q2 will be described below. The channel length modulation coefficient λ cannot be directly measured. Therefore, in this embodiment, the amount of variation in the threshold voltage Vth corresponding to change in drain voltage in correspondence with the channel length modulation coefficient λ is measured. This amount of variation is designated as DIBL (Drain-Induced Barrier Lowering).

Figure 2:
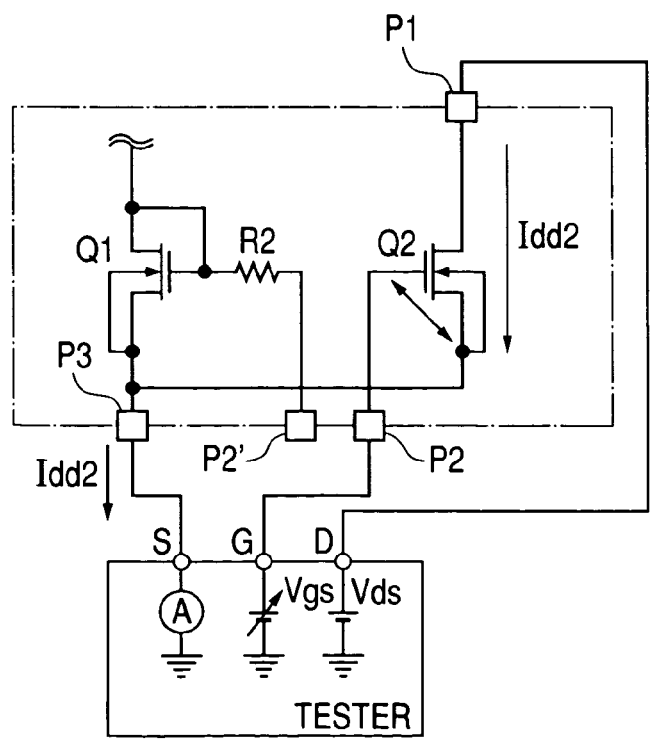
FIG. 2 is a circuitry diagram illustrating how a tester is connected to measure the threshold voltage Vth and DIBL of FET Q2 in the high frequency power amplifier circuit in the embodiment.

FIG. 2 illustrates how a tester is connected to measure the threshold voltage Vth and DIBL of the FET Q2. As illustrated in the figure, the measurement is carried out as follows: a predetermined voltage Vds is applied to the pad P1, that is, the drain terminal of the FET Q2 by the tester. With this state maintained, the voltage Vgs applied through the pad P2 to the gate of the FET Q2 is varied, and a current flowing out of the pad P3 as ground terminal is measured. Thereby, the threshold voltage of Q2 is detected. Further, the voltage Vds applied to the pad P1, that is, the drain terminal of the FET Q2 is varied, and the amount of variation in threshold voltage Vth, or DIBL is thereby measured.

At this time, the pad P2 and the pad P2' adjacent to the pad P2 are electrically shut off from each other. As is evident from comparison with FIG. 16 which illustrates a conventional method for threshold voltage measurement, the gate terminals of the FETs Q2 and Q1 are disconnected from each other in this embodiment. Therefore, the current flowing from the gate of Q2 toward Q1 is eliminated, and what flows out of the pad P3 is only the drain current Idd2 of Q2. Therefore, the threshold voltage Vth and DIBL of the FET Q2 can be measured with accuracy.

If the high frequency power amplifier circuit in the embodiment in FIG. 1 is incorporated into a power module constituting a wireless communication system for amplifying high frequency signals, the following must be done: the gate terminals of the amplifier FET Q2 and the bias FET Q1, that is, the pads P2 and P2' must be connected together. FIGS. 3(A) to 3(D) illustrate variations of how to connect the pads P2 and P2'.

Figure 3A:
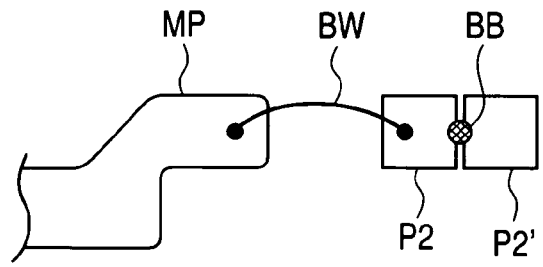
FIGS. 3(A) to 3(D) are explanatory drawings illustrating variations of how to connect pads P2 and P2' in the high frequency power amplifier circuit in the embodiment.
Figure 3B:
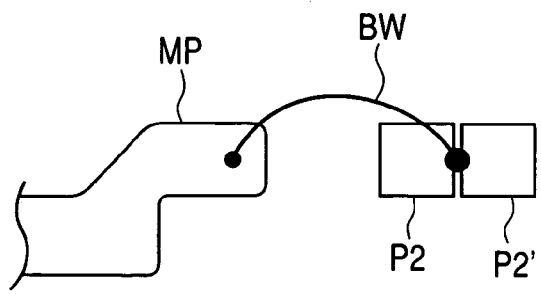

FIG. 3(A) illustrates the way the pads P2 and P2' are connected together by the following procedure: a ball BB for bonding is formed on the boundary between the pads P2 and P2', and the external terminal MP of the module and the pad P2 of the high frequency power amplifier circuit are connected together through a bonding wire BW. Instead of connecting the external terminal MP of the module and the pad P2, the terminal MP and the pad P2' may be connected together through a bonding wire BW. FIG. 3(B) illustrates the way the pads P2 and P2' are connected together by the following procedure: a ball BB at one end of a bonding wire BW is formed on the boundary between the pads P2 and P2'. Thus, connection between the external terminal MP of the module and the pad P2 of the high frequency power amplifier circuit and connection between the pads P2 and P2' are simultaneously carried out.

Figure 3C:
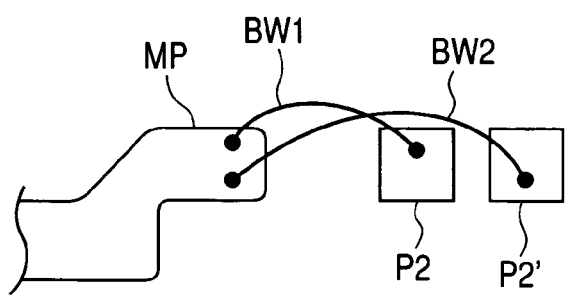
Figure 3D:
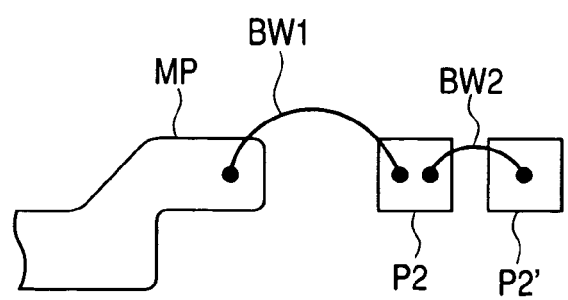

FIG. 3(C) illustrates the way the pads P2 and P2' are connected by the following procedure: the external terminal MP of the module and the pads P2 and P2' of the high frequency power amplifier circuit are connected together through bonding wires BW1 and BW2, respectively. FIG. 3(D) illustrates the way the pads P2 and P2' are connected by the following procedure: the external terminal MP of the module and the pad P2 of the high frequency power amplifier circuit are connected together through a bonding wire BW1, and the pads P2 and P2' are connected together through a bonding wire BW2.

In the configurations in FIGS. 3(A) and 3(B), the spacing between the pads P2 and P2' must be smaller at least than the diameter of the ball BB for bonding. If the diameter of the bonding ball is, for example, 80 μm, the spacing between the pads P2 and P2' only has to be approximately 40 μm which is ½ of the bonding ball diameter in terms of establishment of electrical contact. In terms of prevention of damaging to the substrate which can occur during the formation of the ball BB for bonding, the spacing between the pads P2 and P2' is preferably set to a value not more than 10 μm. In the configurations in FIGS. 3(C) and 3(D), the pads P2 and P2' may be relatively away from each other as in the spacing in ordinary pads. The following configuration is possible depending on the circuit to which the present invention is applied: only a bonding ball BB is formed on the boundary between the pads P2 and P2' without forming a bonding wire BW connected to the pads P2 and P2'. However, this constitution is meaningless for the high frequency power amplifier circuit in this embodiment.

Figure 4:
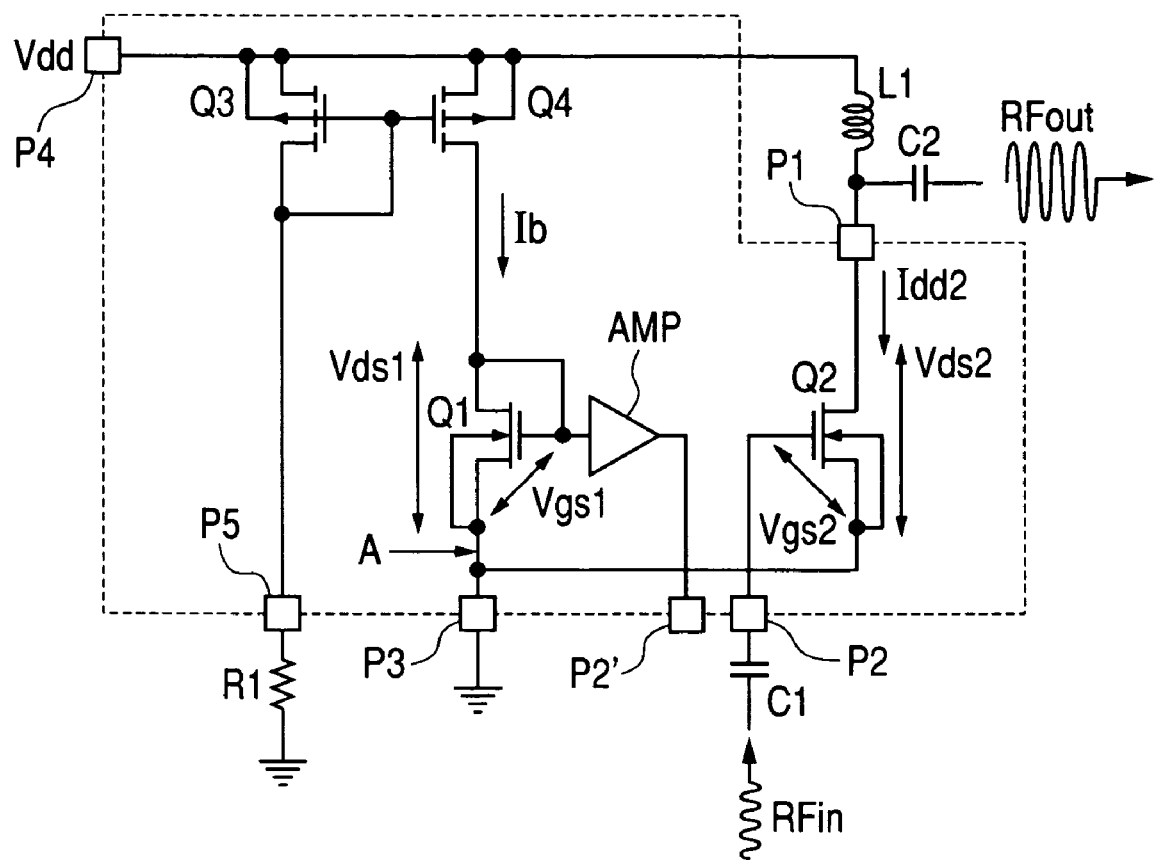
FIG. 4 is a circuitry diagram schematically illustrating the constitution of a second embodiment of the high frequency power amplifier circuit according to the present invention.

FIG. 4 schematically illustrates the constitution of the second embodiment of the high frequency power amplifier circuit according to the present invention. In FIG. 4, the same elements and parts as in the circuit in FIG. 1 are marked with the same reference codes, and the redundant description of them will be omitted. The only difference between the second embodiment and the first embodiment is in that: the first embodiment is provided between the gate terminals of the amplifier FET Q2 and the bias FET Q1 with the resistor R2. The second embodiment is provided with a buffer amplifier AMP instead. This amplifier AMP functions as a voltage follower, and applies the same voltage as the gate voltage of the bias FET Q1 to the gate terminal of the amplifier FET Q2.

Provision of the amplifier AMP enables the enhancement of output response characteristics. Further, the amplifier AMP prevents input high frequency signals Rfin from leaking to the bias FET Q1 as is the case with the resistor R2. The buffer amplifier AMP comprises a CMOS differential amplifier circuit and the like. For MOSFETs constituting the circuit, standard MOSFETs free from the short channel effect are used like the MOSFETs Q3 and Q4 constituting a current mirror circuit. In this embodiment as well, a pad P2' is formed in addition to a pad P2 to which high frequency signals Rfin are inputted. The pad P2' adjoins the pad P2, and is connected with the output terminal of the buffer amplifier AMP.

In this embodiment as well, the pad is divided. The reason is as follows: in general, the output stage of a buffer amplifier AMP is provided with a resistor or pull-down transistor which is connected between output node and grounding point. If the pad is not divided, a current flows to the ground line GND through this resistor or pull-down transistor. Thus, the drain current Idd2 passed through the amplifier FET Q2 cannot be measured with accuracy with an ordinary tester.

Figure 5:
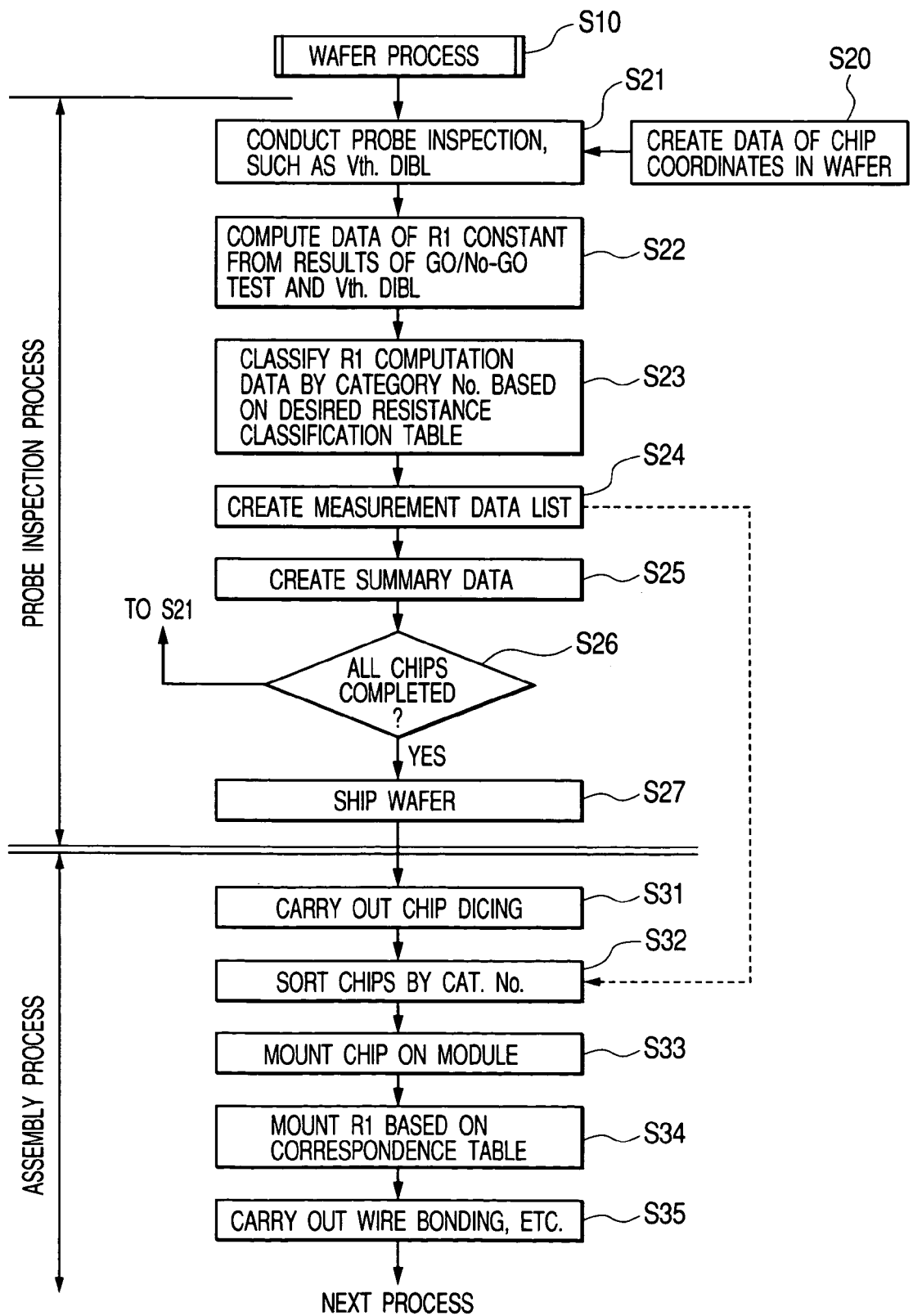
FIG. 5 is a flowchart illustrating an example of the manufacturing method for the high frequency power amplifier circuit in the embodiments and a RF power module incorporating it, in the order of processes.
Figure 6:
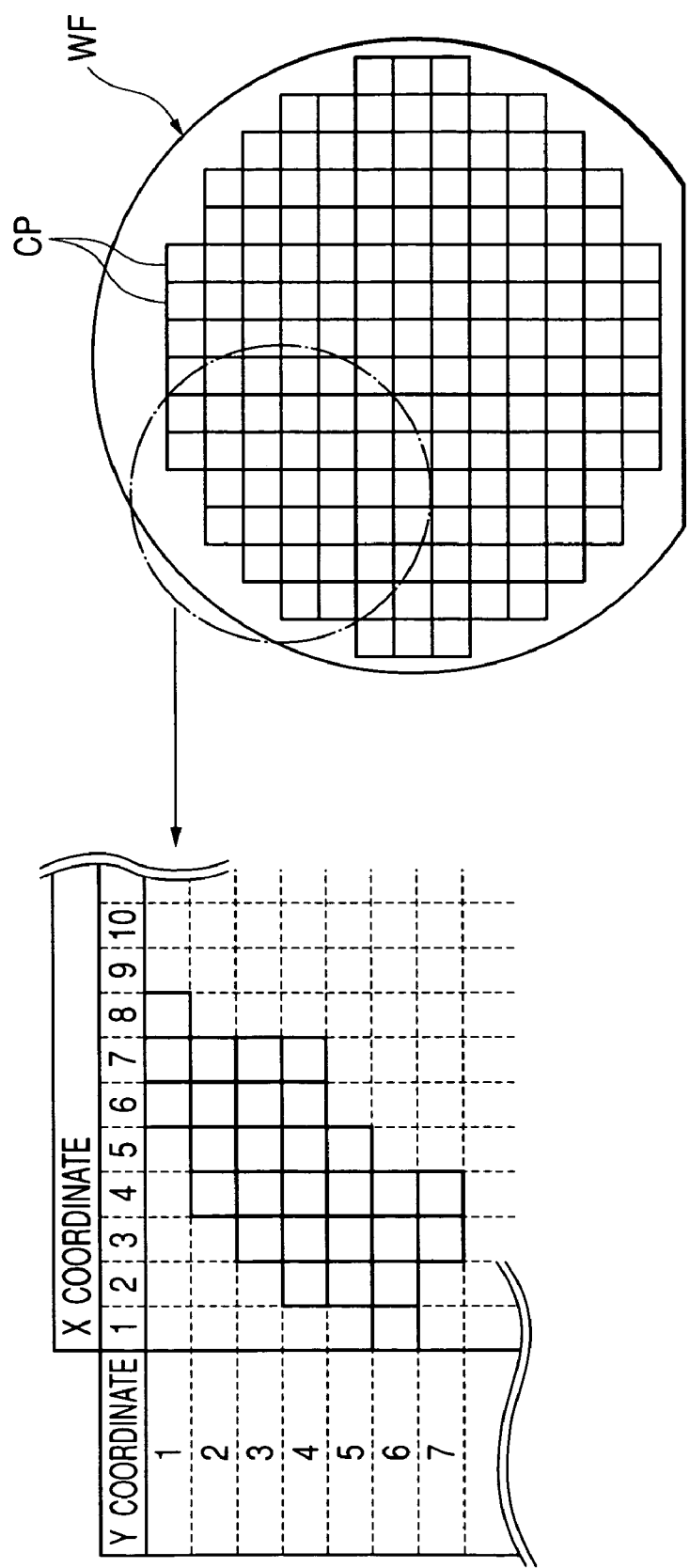
FIG. 6 is a chip coordinate data indicating the correspondence between chips on a wafer and their positions (x and y coordinates).

Next, referring to FIG. 5 to FIG. 7 and FIG. 9, a method for the manufacture of the high frequency power amplifier circuit in the above embodiments and an RF power module incorporating it. FIG. 5 is a flowchart illustrating the manufacturing method in the order of processes. With respect to the manufacturing method for the embodiments, the wafer process wherein high frequency power amplifier circuits are formed over a wafer is the same as conventional manufacturing methods. Therefore, FIG. 5 illustrates only inspection process and assembly process of the manufacturing process which are carried out after the wafer process.

In the wafer process, elements, wiring, pads, and the like constituting a high frequency power amplifier circuit are formed over a semiconductor wafer (Step 10). In parallel with the wafer process, chip coordinate data which indicates the chips CP on the wafer WF, shown as (A) of FIG. 6, and their positions (x and y coordinates) ((B) of FIG. 6) is created with respect to each wafer (Step 20). After the completion of the wafer process, probe inspection is carried out using a tester to measure the characteristics of FET in each chip on the wafer. The characteristics measured include the threshold voltage Vth and DIBL of FET. Using the previously created chip coordinate data, the measured values are stored in memory on a chip-by-chip basis (Step 21).

Next, based on the result of measurement on each chip obtained at Step 21, that is, based on the result of GO/NO-GO test and the measured Vth and DIBL of each chip, computation is carried out (Step 22). This computation is carried out to obtain the resistance value of the resistor R1 most suitable for correcting deviation of the bias point of Q2. In this GO/NO-GO test, ordinary pass/fail judgments, such as a judgment of whether the current of the entire chip is within a predetermined range, are carried out. In addition, it is also judged whether the computed resistance value of the resistor R1 is within the adjustable range of previously prepared resistors for adjustment. That is, it is judged whether deviation of the bias point of Q2 can be corrected by adjusting the resistor R1.

At Step 23, a category number CAT. No under which the measured chip should be classified is determined according to the resistance value computed at Step 22, and the chips are classified. At this time, such a resistance classification table as indicated as Table 1 is used as data conversion table. The resistance classification table provides classifications of chips by the magnitude of resistance value.

TABLE 1

Resistance classification table

| Computed value R1 [Ω] | Mounted R1 [kΩ] | CAT. No. |
|---|---|---|
| 785 ≦ R1 < 865 | 0.82 | 55 |
| 865 ≦ R1 < 955 | 0.91 | 56 |
| 955 ≦ R1 < 1050 | 1 | 57 |
| 1050 ≦ R1 < 1250 | 1.2 | 58 |
| 1250 ≦ R1 < 1550 | 1.5 | 59 |
| 1550 ≦ R1 < 1900 | 1.8 | 60 |
| 1900 ≦ R1 < 2100 | 2 | 61 |

Thereafter, such a measurement data list as illustrated in FIG. 7 is created using the chip coordinate data and stored in a storage device (Step 24). In the measurement data list, information indicating whether each chip is non-defective or defective is in one-to-one correspondence with category numbers CAT. No corresponding to the classifications of the resistors used for adjustment with respect to all the chips on the wafer. The created measurement data list can be used to sort chips in the assembly process.

Further, based on the measurement data list, such summary data as shown in Table 2 is created and stored in a storage device (Step 25). The summary data is an aggregation of the numbers of resistors used as the resistor R1 for adjustment with respect to each wafer. From the summary data, the numbers of components which should be prepared for the assembly process wherein modules are assembled can be learned on a resistance value-by-resistance value basis. Then, it is judged whether creation of the measurement data list has been completed with respect to all the chips on the wafer (Step 26). If not, the operation goes back to Step 21, and the above procedures are carried out with respect to the chip at the next coordinates. If it is judged that the measurement data list to has been created with respect to all the chips, the operation proceeds to Step 27. Then, the finished wafer is shipped together with a storage medium with the above measurement data list and summary data recorded on it, and the operation proceeds to the assembly process.

TABLE 2

| LOT # | | YY00098 | | | |
| CAT. No. | | WAFER N | | | |
| (R1 constant: kΩ) | 1 | 2 | 3 | 4 | 5 |
| 55 (0.82) | 0 | 0 | 0 | 0 | 0 |
| 56 (0.91) | 0 | 61 | 0 | 17 | 0 |
| 57 (1.0) | 2 | 285 | 80 | 360 | 137 |
| 58 (1.2) | 330 | 79 | 280 | 60 | 210 |
| 59 (1.5) | 7 | 22 | 60 | 10 | 100 |
| 60 (1.8) | 108 | 0 | 27 | 0 | 0 |
| 61 (2.0) | 0 | 0 | 0 | 0 | 0 |

In the assembly process, the wafer is cut into chips with a dicing apparatus (Step 31). Subsequently, the chips are sorted by category using the measurement data list created at Step 24 (Step 32). Each of the sorted chips is mounted over the substrate of the module (Step 33). At this time, the resistor R1 corresponding to the category of that chip is selected and mounted (Step 34). Thereafter, bonding wires are formed (Step 35), and the operation proceeds to the next process.

Figure 9:
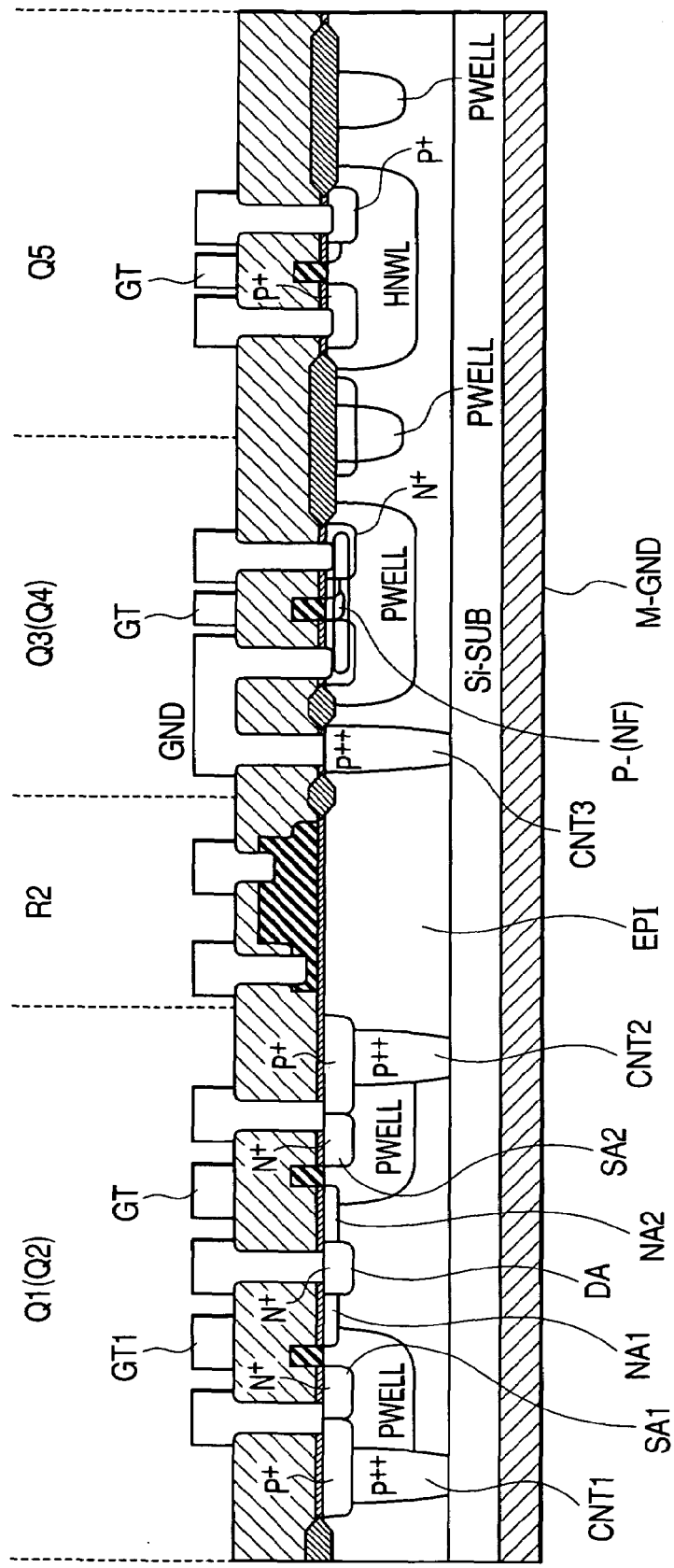
FIG. 9 is a cross-sectional view illustrating an example of a device structure suitable for the high frequency power amplifier circuit in the embodiments.

FIG. 9 illustrates an example of a device structure suitable for the high frequency power amplifier circuit in the embodiments. FIG. 9 does not show all the elements constituting the high frequency power amplifier circuit in the embodiments. It representatively shows the structures of either of the short-channel FETs Q1 and Q2, the resistor R2, either of the standard p-channel MOSFETs Q3 and Q4, and the standard n-channel MOSFET Q5.

The standard n-channel MOSFET Q5 is an element used to constitute the buffer amplifier AMP in the second embodiment in FIG. 4. It is not used in the high frequency power amplifier circuit in the embodiment in FIG. 1. In the second embodiment, the resistor R2 comprises a polysilicon layer formed in the same process as for the polysilicon layer which forms the gate electrodes of the FETs Q1 and Q2 and the MOSFETs Q3, Q4, and Q5. However, its constitution is not limited to this. With respect to the FETs Q1 and Q2, two gate electrodes GT1 and GT2 are disposed with one drain area DA in-between, and further source areas SA1 and SA2 are disposed on both sides of them. As a result, at first glance, there seem to be two FETs. However, the gate electrodes GT1 and GT2 are connected together at some point not shown, and the FETs are constituted so as to operate as one FET.

In the high frequency power amplifier circuit in this embodiment, lateral MOS is used for the n-channel FETs Q1 and Q2 and MOSFET Q5. Then, their source terminals are connected with a conductive layer M-GND as ground line formed on the entire underside of the substrate. If the device is provided with such a structure, heat radiation is facilitated to reduce the thermal resistance, and oscillation is prevented.

When the structure of the FETs Q1 and Q2 shown on the left side of FIG. 9 is viewed, the following turns out with respect to the high frequency power amplifier circuit having such a device structure: the $n^+$-source areas SA1 and SA2 are connected with the silicon substrate Si-SUB through heavily doped $P^{++}$-contact layers CNT1 and CNT2 which are formed so that they penetrate an epitaxial growth layer EPI.

Figure 16:
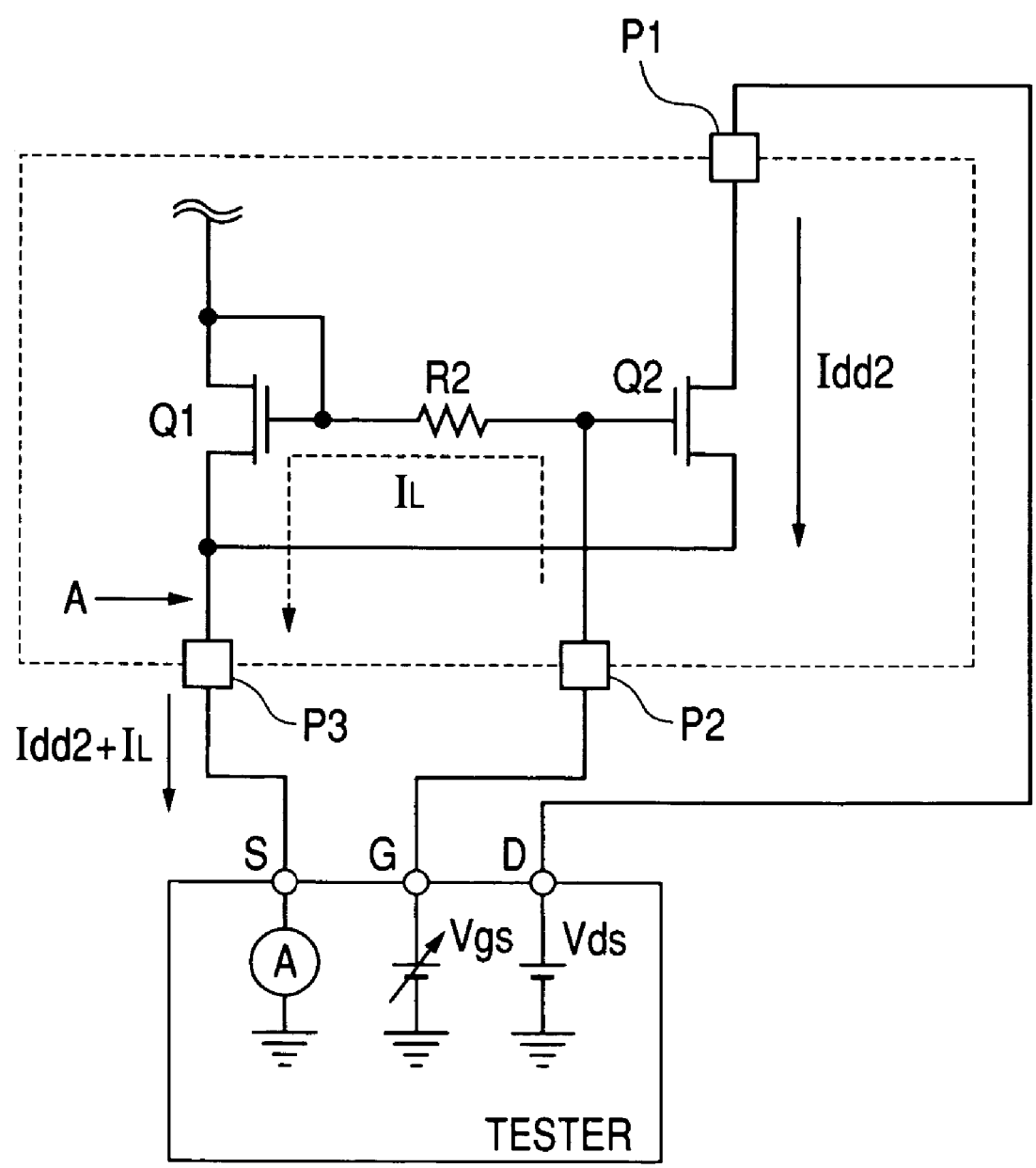
FIG. 16 is a circuitry diagram illustrating how a tester is connected to measure the characteristics of FET constituting a conventional high frequency power amplifier circuit.

Therefore, it turns out that: with the device structure illustrated in FIG. 9, it is difficult to form a switch element at a point marked with "A" between the source terminal of the FET Q1 and the pad P3 in the circuit in FIG. 1 or FIG. 4. That is, it is impossible to measure the drain current passed through the FET Q2 by the following procedure: a switch element is placed between the source terminal of the FET Q1 and the pad P3; the switch element is turned off; and thereby the path of the leakage current IL going from the pad P2 to the gate terminal to the drain terminal to the source terminal of the FET Q1 to the pad P3, as illustrated in FIG. 16, is blocked. Therefore, the input pad P2 for high frequency signal Rfin is divided as in the embodiments in FIG. 1 and FIG. 4. In the high frequency power amplifier circuit having the device structure illustrated in FIG. 9, this is highly effective in measuring the drain current passed through Q2 with accuracy.

As illustrated in FIG. 9, the FETs Q1 and Q2 are so formed that: the n-areas (lower concentration than the drain area DA) NA1 and NA2 between the channel area directly under the gate electrode and the drain area DA is larger in length than the n-area between channel and drain of the standard MOSFET Q5. Also, the n-areas NA1 and NA2 are larger in length than the p-area between channel and drain of the p-channel Q3 and Q4. Thus, Q1 and Q2 are provided with a higher breakdown voltage than Q3 to Q5.

Figure 8:
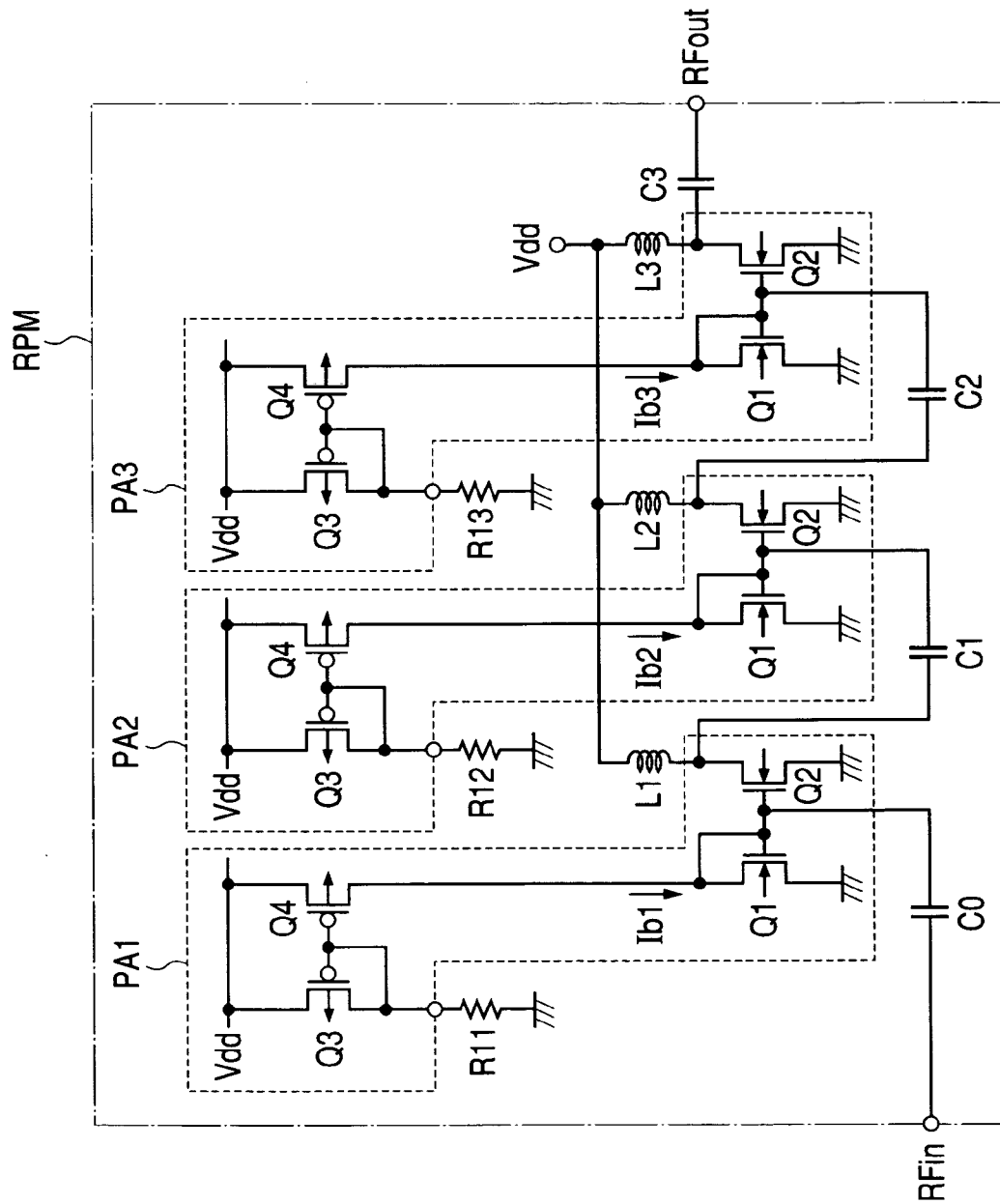
FIG. 8 is a circuitry diagram illustrating an embodiment of the RF power module using the high frequency power amplifier circuit to which the present invention is applied.

FIG. 8 illustrates an embodiment of the RF power module using the high frequency power amplifier circuit to which the present invention is applied. The RF power module RPM in the embodiment is constituted as follows: three high frequency power amplifier circuits PA1, PA2, and PA3 having such a constitution as illustrated in FIG. 1 or FIG. 4 are mounted over one insulating substrate, such as ceramic substrate. The power amplifier circuits PA1, PA2, and PA3 are mounted together with resistors R11, R12, and R13 for adjustment, inductance elements L1, L2, and L3, and capacitive elements C0, C1, C2, and C3 for cutting the direct-current components in high frequency signals to be amplified.

The high frequency power amplifier circuits PA1, PA2, and PA3 are constituted in multistage configuration in cascade connection. More specifically, the output terminal (pad P1) of the high frequency power amplifier circuit in a preceding stage is connected with the input terminal (pad P2) of the high frequency power amplifier circuit in the next stage, and so on. The resistors R1, R12, and R13 are elements equivalent to the resistor R1 in the embodiment in FIG. 1. The following constitution may be adopted: the first- and second-stage high frequency power amplifier circuits PA1 and PA2 are formed over a semiconductor chip, and only the third-stage high frequency power amplifier circuit PA3 is formed over another semiconductor chip. Alternatively, two sets of high frequency power amplifier circuits PA1, PA2, and PA3 connected in three stages, as mentioned above, may be mounted over one module substrate. Thus, for example, transmission signals in GSM (Global System for Mobile Communication) and transmission signals in DCS (Digital Cellular System) can be amplified, respectively.

The inductance elements L1 to L3 can be constituted of microstrip lines or the like formed over the insulating substrate, such as ceramic substrate. The capacitive elements C0 to C3 for cutting direct currents may be discrete components. If a laminate of a plurality of dielectric layers is used for the insulating substrate, capacitors whose electrodes are conductor layers formed so that the conductor layers are opposed to the front side and back side of any dielectric layer may be used.

The first- and second-stage high frequency power amplifier circuits PA1 and PA2 may be constituted as follows: the MOSFET Q3 as origin of duplication which constitutes a current mirror circuit and the resistor R1 for adjustment connected with its drain terminal are shared between the amplifier circuits PA1 and PA2. The gate terminals of the respective MOSFETs Q4 for supplying bias currents Ib1 and Ib2 are connected with the gate terminal of the MOSFET Q3 as common origin of duplication. Then, by making different the size of the MOSFETs Q4, the bias currents Ib1 and Ib2 corresponding to the respective amplifier FETs Q2 are let to flow. In the RF power module in FIG. 8, the high frequency power amplifier circuits are connected in three stages. Or, they may be connected in four or more stages.

The RF power module in FIG. 8 does not have a power control terminal. Therefore, the RF power module can be utilized to constitute a cellular phone capable of transmission in EDGE (Enhanced Data Rates for GSM Evolution) and WCDMA (Wide-band Code Division Multiple Access). Such a cellular phone is so constituted that power control is carried out by controlling the amplitude of high frequency signals through a circuit preceding the RF power module.

The EDGE method is a method wherein data communication is carried out by $3\pi/8$ rotating 8-PSK (Phase Shift Keying) modulation. The 8-PSK modulation is such a kind of APSK modulation that amplitude shift is added to phase shift of carrier waves in PSK modulation. Therefore, for EDGE cellular phones, the following system configuration is effectively adopted: amplitude modulation of high frequency signals based on transmission data and amplitude control of high frequency signals based on output level instruction signals are carried out through a circuit preceding the RF power module.

Up to this point, the invention made by the inventors has been specifically described based on the embodiments. However, the present invention is not limited to the above embodiments, and may be modified in various ways to the extent that its scope is not departed from, needless to add.

Some examples will be taken. In the above embodiments, the bias current Ib supplied to the bias FET Q1 is adjusted by adjusting the resistance value of the external resistor R1 connected in series with the MOSFET Q3 constituting a current mirror circuit. Alternatively, the constitution illustrated in FIG. 10 may be adopted. In this constitution, the drain terminal of the bias FET Q1 is connected with the pad P5. Then, the bias current Ib is adjusted by adjusting the current of the constant current source CI connected with the pad P5 outside the chip. In this case as well, the resistors constituting the constant current source CI may be selected or adjusted based on the characteristics of the amplifier FET Q2 measured as in the above embodiments.

Figure 10:
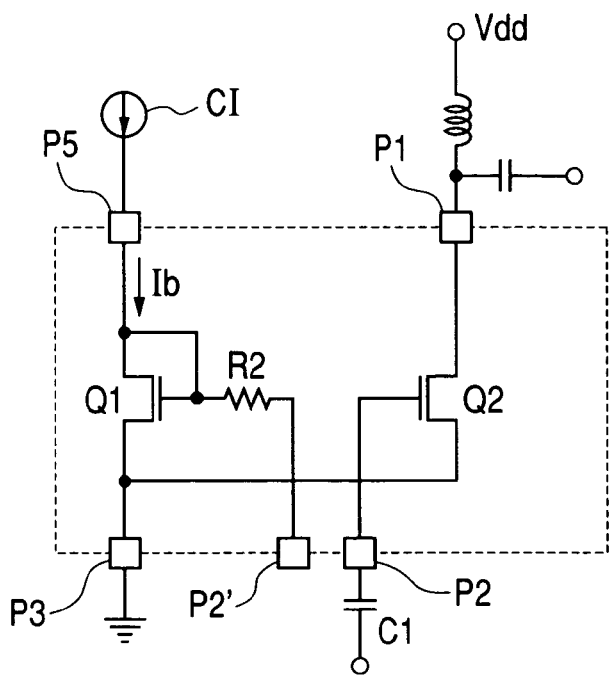
FIG. 10 is a circuitry diagram illustrating a modification to the high frequency power amplifier circuit according to the present invention.

Or, instead of the constant current source CI in FIG. 10, a resistor for adjustment may be connected between a terminal to which a constant voltage set to a desired value is applied and the pad P5. In this case, the value of the resistor is determined based on the characteristics of the amplifier FET Q2 measured as in the above embodiments. Or, the bias FET Q1 may be constituted of a plurality of FETs in parallel configuration. In this case, the number of FETs used is determined based on the characteristics of the amplifier FET Q2 measured as in the above embodiments. Then, superfluous FETs are disconnected or a required number of FETs are connected according to the determined number of FETs.

In the above embodiments, the pad P2 to which high frequency signals Rfin are inputted is divided to cut off the path of a leakage current going from the pad P2 to the bias FET Q1. With this state maintained, the drain current of the amplifier FET Q2 is measured. For the embodiment wherein the buffer amplifier AMP is provided as illustrated in FIG. 4, the following constitution may be adopted: with the buffer amplifier AMP kept off, that is, with the output controlled to high impedance, the drain current of the amplifier FET Q2 is measured. Or, a switch which cuts the sink current of the buffer amplifier AMP may be provided. In this case, during measurement, the operating current of the switch and the amplifier AMP is turned off.

The above description is given to the embodiments wherein the bias transistor Q1 and the amplifier transistor Q2 are constituted of MOSFETs. If the present invention is applied to cases where Q1 and Q2 are constituted of other transistors, the same effect can be obtained. Such other transistors include SiGe MOSFET, GaAs MESFET, GaAs HBT (Hetero junction Bipolar Transistor), SiGe HBT, and HEMT (High Electron Mobility Transistor).

Figure 11:
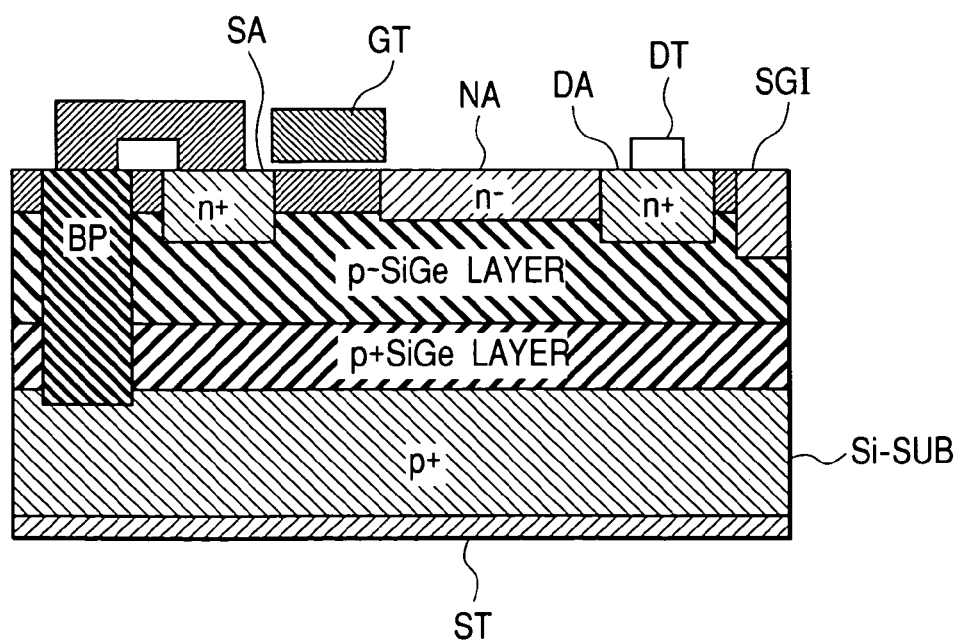
FIG. 11 is a cross-sectional view illustrating an example of an element structure adopted when SiGe MOSFET is used as amplifier transistor in the high frequency power amplifier circuit according to the present invention.
Figure 12:
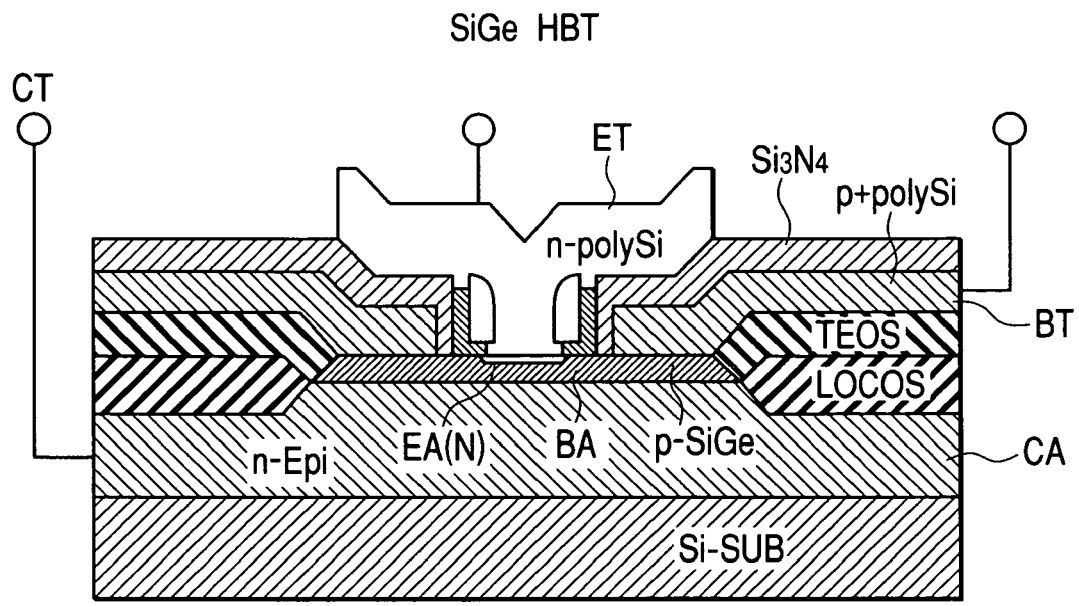
FIG. 12 is a cross-sectional view illustrating an example of an element structure adopted when SiGe HBT is used as amplifier transistor in the high frequency power amplifier circuit according to the present invention.

FIG. 11 illustrates the structure of SiGe MOSFET, and FIG. 12 illustrates the structure of SiGe HBT. The structures of GaAs MESFET, GaAs HBT, and HEMT elements are the same as the structures of those publicly known, and their figures are omitted. In FIG. 11, reference code Si-SUB denotes silicon substrate; GT denotes polysilicon gate electrode; DT denotes drain electrode; DA denotes drain area; SA denotes source area; ST denotes source electrode which is formed on the entire underside of the substrate; BP denotes p-source penetrating layer; and SGI denotes insulating film.

In FIG. 12, reference code Si-SUB denotes silicon substrate; BT denotes polysilicon base electrode; ET denotes emitter electrode; CT denotes collector electrode; CA denotes collector area which is formed over the substrate Si-SUB and comprises a low-concentration n-epitaxial layer; BA denotes base area which is formed over the epitaxial layer and comprises a p-SiGe layer; and EA denotes emitter area which is formed on the surface of the SiGe layer and comprises an n-diffusion layer.

Figure 13:
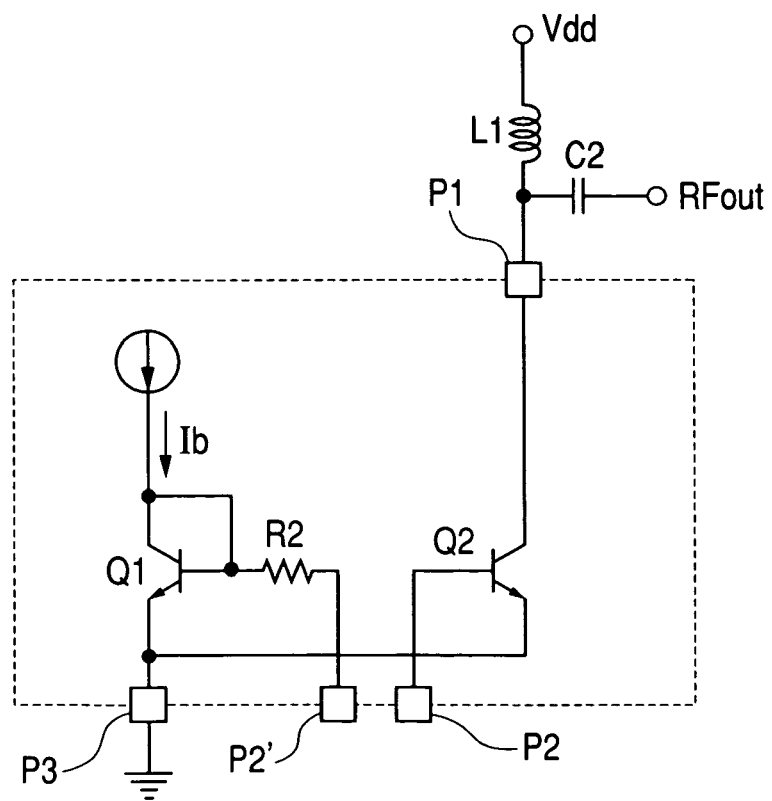
FIG. 13 is a circuitry diagram schematically illustrating the constitution of a high frequency power amplifier circuit which uses bipolar transistors instead of FETs.
Figure 14:
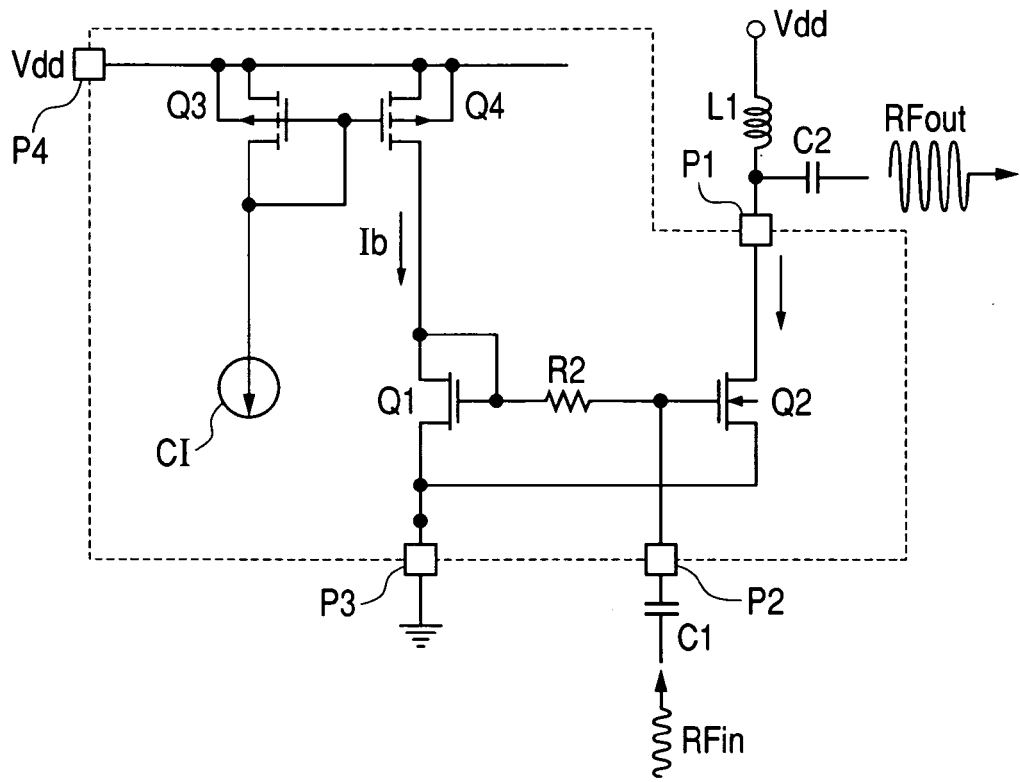
FIG. 14 is a circuitry diagram illustrating an example of the conventional high frequency power amplifier circuit.

Hetero junction bipolar transistors of such a structure and common vertical bipolar transistors are free from the short channel effect which is observed in FETs, but they involve the Early effect. For this reason, in such a high frequency power amplifier circuit as illustrated in FIG. 13 that uses bipolar transistors for the bias transistor Q1 and the amplifier transistor Q2 in FIG. 1 or FIG. 4, a problem arises. The assumption is made that elements with the base of a transistor reduced in thickness are formed for the enhancement of high frequency power amplifier characteristics. In this case, if the element size (thickness of base) is varied from chip to chip due to production tolerance, the bias point of the base is varied from chip to chip due to the Early effect. As a result, there is a possibility that the high frequency power amplifier characteristics cannot be stabilized. However, the bias point can be corrected by measuring the characteristics of transistors by the technique in the above embodiments and adjusting the resistor R1 for adjustment. Thus, the high frequency power amplifier characteristics can be stabilized.

This is especially effective for cases where HBT of such structure as illustrated in FIG. 12 is used for the bias transistor Q1 and the amplifier transistor Q2 in FIG. 1 or FIG. 4. In this case, the following procedure is difficult to implement: a switch element for turn-on/off is placed between the emitter of the transistor Q1 and the external terminal P3; then, the path through which a leakage current from the transistor Q2 flows is blocked during measurement of characteristics. Therefore, dividing the pad P2 into two, as in the above embodiments, is highly effective.

As mentioned above, the above embodiments are so constituted that: the value of the external resistor R1 is adjusted to adjust the bias current Ib supplied from the current mirror circuit of MOSFETs Q3 and Q4 to the bias transistor Q1. Thereby, the gate bias point of the amplifier FET Q2 is adjusted. However, if the amplifier transistor Q2 comprises a bipolar transistor, another constitution may be adopted. In this case, a current is passed through the resistor R2 placed between the gate terminals of Q1 and Q2 in normal operating state. Therefore, the resistor R2 is so constituted that it can be trimmed, and the resistance value of the resistor R2 is adjusted according to the measured values of the amplifier transistor Q2. Thereby, the bias point of the amplifier transistor Q2 is adjusted.

Various methods are available for constituting the resistor R2 so that it can be trimmed. An example is such that a plurality of resistance elements are first provided and some resistance elements are disconnected according to a desired resistance value setting. Another example is such that the resistor is formed of a polysilicon layer and the like and its resistance value is varied by laser annealing or the like.

The above description is given to the embodiments wherein the pad P2 which is connected with the gate or base terminal of the transistors Q1 and Q2 and fed with high frequency signals is divided into two and the two are arranged in line. However, other constitutions may be adopted. An example is such that: divided pads are formed in different conductive layers, and vertically stacked with an insulating film in-between. After the characteristics of Q2 are measured, a high voltage is applied or any other measure is taken to destroy the insulating film. Thereby, the upper and lower conductive layers (pads) are electrically connected with each other.

Effects produced according to the representative aspects of the present invention will be briefly described below.

According to the present invention, the characteristics of an amplifier transistor can be measured with accuracy. Thus, the following advantages are brought only by determining and adjusting the resistance value of a resistor for adjustment according to the result of measurement of the characteristics of the amplifier transistor: deviation of a bias point due to the short channel effect of FET or the like can be corrected, and thus variation in high frequency power amplifier characteristics between high frequency power amplifier circuit chips can be reduced.

Sometimes EFT with short channel length or a bipolar transistor with small base width is used for amplifier transistor in a high frequency power amplifier circuit for the enhancement of high frequency power amplifier characteristics and size reduction. According to the present invention, the following advantages are brought also in this case: variation in characteristics from module to module can be reduced, and such modules can be manufactured without significant change to conventional manufacturing processes.

What is claimed is:

1. A high frequency power amplifier circuit for amplifying high frequency signals, comprising:
   a first pad as a bonding pad;
   a second pad as a bonding pad which is different from the first pad;
   an amplifying transistor for amplifying high frequency signals and whose control terminal is coupled to the first pad; and
   a bias circuit for generating a bias signal for the amplifying transistor and which includes a first transistor whose output terminal and control terminal are coupled to the second pad,
   wherein the first pad and the second pad is coupled to each other via conductive elements, and
   wherein the amplifying transistor and the first transistor forms a current mirror circuit via the first pad, the second pad and conductive elements.

2. The high frequency power amplifier circuit according to claim 1,
   wherein the conductive elements are bonding wires,
   wherein the first pad and the second pad are disposed with a distance smaller than ½ of the diameter of a bonding ball therebetween.

3. The high frequency power amplifier circuit according to claim 1,
   wherein a resistance element is provided between the control terminal of the first transistor and the second pad.

4. The high frequency power amplifier circuit according to claim 3, wherein the resistance element is so constituted that its resistance value is adjustable.

5. The high frequency power amplifier circuit according to claim 1, wherein a buffer amplifier which applies the same voltage as the control voltage of the bias transistor to the control terminal of the amplifier transistor is connected between the control terminal of the first transistor and the control terminal of the amplifier transistor, and the output state of the buffer amplifier is externally controllable.

6. The high frequency power amplifier circuit according to claim 5, wherein the buffer amplifier comprises a field-effect transistor whose threshold voltage and channel length modulation coefficient are hardly varied due to variation in channel length caused by production tolerance, and the first transistor and the amplifier transistor comprise field-effect transistors whose channel length is shorter than that of a field-effect transistor constituting the buffer amplifier.

7. A high frequency power amplifier electronic component, wherein a plurality of high frequency power amplifier circuits for amplifying high frequency signals, comprising;

a first pad;

a second pad;

an amplifying transistor for amplifying high frequency signals and whose control terminal is coupled to the first pad; and a bias circuit for generating a bias signal for the amplifying transistor and which includes a first transistor whose output terminal and control terminal are coupled to the second pad, wherein the first pad and the second pad is coupled to each other via conductive elements, wherein the amplifying transistor and the first transistor form a current mirror circuit via the first pad, the second pad and conductive elements, and are mounted over one insulating substrate, and the output terminal of any high frequency power amplifier circuit is connected with the input terminal of another high frequency power amplifier circuit, and wherein in each high frequency power amplifier circuit, the first pad and the second pad are electrically connected together through a conductive material formed so that it lies astride these pads.

8. A high frequency power amplifier electronic component comprising, over an insulating substrate:

a high frequency power amplifier circuit including a first external terminal, an amplifier transistor for amplifying high frequency signals inputted through the first external terminal, a second external terminal for outputting high frequency signals amplified by the amplifier transistor, a bias transistor connected with the amplifier transistor in current mirror configuration, a current mirror circuit which comprises a first transistor and a second transistor whose control terminals are connected together and generates a bias current supplied to the bias transistor, and a third external terminal connected with a transistor as origin of current duplication constituting the current mirror circuit; and an external resistance element connected with the third external terminal, wherein an idle current passed through the amplifier transistor is adjustable according to the resistance value of the resistance element.

9. A high frequency power amplifier electronic component manufacturing method, comprising:

a wafer process of forming said high frequency power amplifier circuit according to claim 4 which is so constituted that the bias voltage for an amplifier transistor for amplifying high frequency signals is supplied from a bias transistor connected with the amplifier transistor in current mirror configuration over a semiconductor wafer;

an inspection process of measuring the characteristics of the amplifier transistor with respect to each chip on the wafer which underwent the wafer process;

a data storing process of determining the resistance value of a resistor for adjustment based on the characteristics of the amplifier transistor measured in the inspection process and storing the resistance value in a storage device or on a storage medium together with the positional information of the chip;

a resistor selecting process selecting a value for said resistance element which is determined to be most suitable for the high frequency power amplifier circuit in accordance with the data made by said data storing process read out from the storage device or storage medium; and a mounting process of mounting the high frequency power amplifier circuit and the selected resistor over one insulating substrate.

10. A high frequency power amplifier circuit in which bias voltage for an amplifier transistor for amplifying high frequency signals is supplied from a bias transistor connected with the amplifier transistor in current mirror configuration, wherein a coupling node of the current mirror configuration which is between a control terminal of said amplifier transistor and a control terminal of the bias transistor is provided with an electrical disconnection means, and wherein a characteristic of the amplifier transistor is capable of being measured by decoupling the current mirror configuration by the electrical disconnection means without a leakage current through the bias transistor.

11. The high frequency power amplifier circuit according to claim 1, wherein a characteristic of the amplifier transistor is capable of being measured by decoupling the current mirror circuit by removing the conductive elements without a leakage current through the bias transistor.

* * * * *